US009183337B1

(12) United States Patent
Nagpal et al.

(10) Patent No.: US 9,183,337 B1
(45) Date of Patent: Nov. 10, 2015

(54) CIRCUIT DESIGN WITH PREDEFINED CONFIGURATION OF PARAMETERIZED CORES

(71) Applicant: Xilinx, Inc., San Jose, CA (US)

(72) Inventors: Sumit Nagpal, Hyderabad (IN); Sreevidya Maguluri, Hyderabad (IN); Prashanth Kumar, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/455,029

(22) Filed: Aug. 8, 2014

(51) Int. Cl.
*G06F 17/50* (2006.01)

(52) U.S. Cl.
CPC .................................... *G06F 17/505* (2013.01)

(58) Field of Classification Search
CPC ........................... G06F 17/505; G06F 17/5045
USPC .................................................. 716/101, 103
See application file for complete search history.

(56) References Cited

U.S. PATENT DOCUMENTS 5,583,450 A 12/1996 Trimberger et al.
5,600,263 A 2/1997 Trimberger et al.
5,629,637 A 5/1997 Trimberger et al.
5,646,545 A 7/1997 Trimberger et al.
5,701,441 A 12/1997 Trimberger
5,761,483 A 6/1998 Trimberger
5,778,439 A 7/1998 Trimberger et al.
5,784,313 A 7/1998 Trimberger et al.
5,825,662 A 10/1998 Trimberger
5,838,954 A 11/1998 Trimberger
5,959,881 A 9/1999 Trimberger et al.
5,978,260 A 11/1999 Trimberger et al.
6,263,430 B1 7/2001 Trimberger et al.
6,480,954 B2 11/2002 Trimberger et al.
7,165,229 B1 * 1/2007 Gathoo et al. ................ 716/105
7,467,175 B2 12/2008 Simkins et al.
7,467,177 B2 12/2008 Simkins et al.
7,472,155 B2 12/2008 Simkins et al.
7,480,690 B2 1/2009 Simkins et al.
7,506,298 B1 * 3/2009 Ingoldby et al. .............. 716/104
7,574,679 B1 * 8/2009 Gathoo et al. ................ 716/100
7,590,965 B1 * 9/2009 Ingoldby et al. .............. 716/102
7,840,627 B2 11/2010 Simkins et al.
7,840,630 B2 11/2010 Wong et al.
7,844,653 B2 11/2010 Simkins et al.
7,849,119 B2 12/2010 Vadi et al.
7,853,632 B2 12/2010 Ching et al.
7,853,634 B2 12/2010 Simkins et al.
7,853,636 B2 12/2010 New et al.
7,860,915 B2 12/2010 Vadi et al.
7,865,542 B2 1/2011 New et al.
7,870,182 B2 1/2011 Thendean et al.
7,882,165 B2 2/2011 Simkins et al.
8,079,013 B1 * 12/2011 Ma et al. ....................... 716/139
8,495,122 B2 7/2013 Simkins et al.

* cited by examiner

*Primary Examiner* — Sun Lin
(74) *Attorney, Agent, or Firm* — Keith Taboada

(57) ABSTRACT

A method of processing a circuit design in a circuit design tool includes: identifying selection of a parameterized core to be instantiated in a description of the circuit design managed by the circuit design tool and configured for implementation in target hardware; processing a configuration file for the parameterized core to select a set of parameter values from a plurality of sets of parameter values dynamically based at least in part on the target hardware; creating an instance of the parameterized core in the circuit design having the selected set of parameter values; and implementing the circuit design for the target hardware.

20 Claims, 7 Drawing Sheets

502

```
proc getPresetInfo()
{
        return
        {
                presetName => NAME,
                displayText => "XXXX"
                description => "This preset is applicable to ...."
                IP_Identifier => ID
                Author => XYZ
        }
}
```

504

```
proc isPresetApplicable()
{
        # Access project property "boardName"
        If { boardName == "XXXX" } {
                return true;
        } else {
                return false;
        }
}
```

506

```
proc applyPreset()
{
        return [dict create \
                CONFIG.PARAMETER1 {VALUE1} \
                CONFIG.PARAMETER2 {VALUE2} \
                CONFIG.PARAMETER3 {VALUE3} \
                CONFIG.PARAMETER4 {VALUE4} \
        ]
}
```

```
proc applyPreset()
{
        # Access project property "device"
        If { device == "123" } {
                return [dict create \
                        CONFIG.PARAMETER1 {VALUE1a} \
                        CONFIG.PARAMETER2 {VALUE2a} \
                        CONFIG.PARAMETER3 {VALUE3a} \
                        CONFIG.PARAMETER4 {VALUE4a} \
                ]
        } else {
                return [dict create \
                        CONFIG.PARAMETER1 {VALUE1b} \
                        CONFIG.PARAMETER2 {VALUE2b} \
                ]
        }
}
```

CIRCUIT DESIGN WITH PREDEFINED CONFIGURATION OF PARAMETERIZED CORES

TECHNICAL FIELD

The present disclosure generally relates to electronic circuit design and, in particular, to circuit design with predefined configuration of parameterized cores.

BACKGROUND

Circuit designs for integrated circuits (ICs) can be generated using a variety of techniques. In some examples, designers can write register-transfer level (RTL) code program-language code, or a combination thereof to design a circuit for implementation in a target IC device. The target IC device can be a programmable IC, such as a field programmable gate array (FPGA), a mask-programmable IC, such as an application specific integrated circuit (ASIC), or the like. During circuit design, designers can make use of pre-designed circuits available from logic libraries provided for a particular target IC device. Such pre-design circuits are referred to as "Intellectual Property (IP) cores" or just "cores". The cores are generally tested and debugged blocks of logic that can be used for specific purposes to simplify implementation of a circuit in a particular target IC device.

Some cores are static. A designer can select a static core, such as a counter, from a library for use in a given circuit design. Although the counter may not be customizable for a particular designer's needs, several counters may be available in the library and a designer can select the appropriate counter for a particular design. Other cores are parameterized cores. Parameterized cores can be specifically configured for a designer's particular needs by defining parameter values. The parameter values translate into RTL parameters, which customize the logic and functionality of the core. For example, a designer can select a parameterized counter from a library having a width parameter. When the designer creates an instance of the counter, the designer can define a value for the width parameter (e.g., a 4-bit counter, an 8-bit counter, etc.).

Some parameterized cores can include a large number of parameters, some of which are dependent on others. In some cases, a designer may not be familiar with all the parameters of a given core, particularly when some cores define parameters differently than other cores. A designer may find it cumbersome to modify each and every parameter of a parameterized core. For some parameterized cores, a designer needs to understand the purpose of several parameters, which may not have a standard definition, and be able to identify a good combination of parameter values. A designer may have to resort to testing of different sets of parameter values, particularly when some parameters are dependent on other parameters, before finding an appropriate configuration for the particular circuit design and target IC device.

SUMMARY

Circuit design with predefined configuration of parameterized cores is described. In an example implementation, a method of processing a circuit design in a circuit design tool includes: identifying selection of a parameterized core to be instantiated in a description of the circuit design managed by the circuit design tool and configured for implementation in target hardware; processing a configuration file for the parameterized core to select a set of parameter values from a plurality of sets of parameter values dynamically based at least in part on the target hardware; creating an instance of the parameterized core in the circuit design having the selected set of parameter values; and implementing the circuit design for the target hardware.

In another example implementation, a non-transitory computer readable medium comprising instructions which, when executed in a computer system, cause the computer system to carry out a method of processing a circuit design in a circuit design tool. The method comprises: identifying selection of a parameterized core to be instantiated in a description of the circuit design managed by the circuit design tool and configured for implementation in target hardware; processing a configuration file for the parameterized core to select a set of parameter values from a plurality of sets of parameter values dynamically based at least in part on the target hardware; creating an instance of the parameterized core in the circuit design having the selected set of parameter values; and implementing the circuit design for the target hardware.

In yet another example implementation, a computer system including a circuit design tool executing therein configured to process a circuit design includes a design entry module and an implementation module. The design entry module is configured to: identify selection of a parameterized core to be instantiated in a description of the circuit design managed by the circuit design tool and configured for implementation in target hardware; process a configuration file for the parameterized core to select a set of parameter values from a plurality of sets of parameter values dynamically based at least in part on the target hardware; and create an instance of the parameterized core in the circuit design having the selected set of parameter values. The implementation module is configured to implement the circuit design for the target hardware.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting.

FIGS. 5A and 5B illustrate example functions that can be employed in a script of a core preset file.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
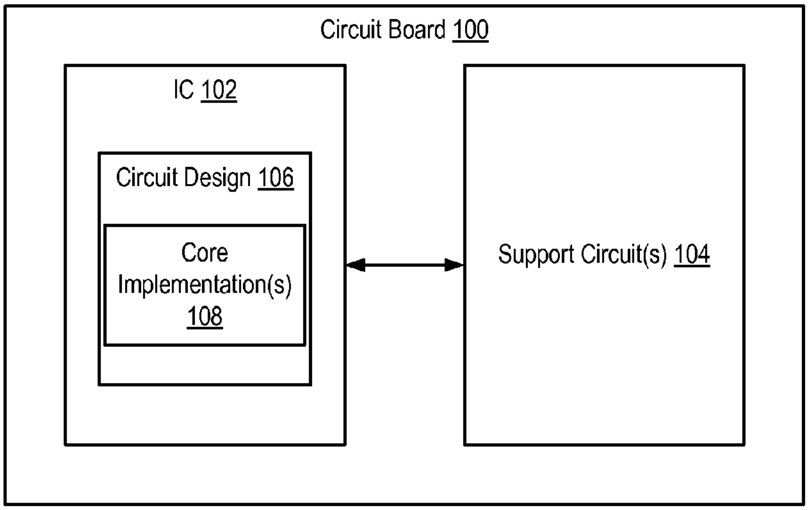
FIG. 1 is a block diagram depicting target hardware for a circuit design according to an example implementation.

Circuit design with predefined configuration of parameterized cores is described. In an example implementation, a circuit design tool identifies selection of a parameterized core to be instantiated in a description of the circuit design configured for implementation in target hardware. The target hardware includes an integrated circuit (IC), such as an FPGA, ASIC, or the like. The parameterized core can be selected from a library of "intellectual property (IP)" cores. An IP core (also referred to herein as a "core") is a description of a logic block having pre-designed functionality. End users can create instances of cores in their circuit designs. A parameterized core includes parameters that can be configured to customize the logic and functionality of the core. Some or all parameters of a parameterized core can have default values, which are typically generic and not specific to the target hardware.

In example implementations described herein, a parameterized core can be associated with one or more configuration files that include one or more predefined configurations (also referred to as a "preset configurations") of parameters. Each preset configuration includes a set of parameter values for the parameterized core. For example, different preset configurations can be specified for the parameterized core for different target hardware. The circuit design tool processes configuration file(s) for the parameterized core to select a set of parameter values from potential sets of parameter values dynamically based at least in part on the target hardware. The circuit design tool can then create an instance of the parameterized core in the circuit design having the selected set of parameter values. The circuit design can then be implemented for the target hardware.

Preset configurations for parameterized cores provide ease of use for the end user through a faster method of core configuration without the need of changing every parameter value manually. A given parameterized core can include hundreds of parameters, which have to be understood by the end user and configured correctly for the target hardware in order for the core to function. Core providers can establish preset configurations for parameterized cores, which can be tested a priori for different target hardware so that they are guaranteed to work when used by the end user. In some examples, a preset configuration can dynamically select among different parameter value sets based on project properties defined for the circuit design within the circuit design tool. Thus, a given present configuration can adapt to the current project (e.g., adapt to particular attributes of target hardware). In some examples, the preset configurations are extensible by the end user. The end user can modify one or more parameter values and then establish a new preset configuration for a parameterized core. The new preset configuration can be entirely new, or based on a previous preset configuration. These and other aspects are described further below.

Turning now to the figures, FIG. 1 is a block diagram depicting target hardware for a circuit design according to an example implementation. The target hardware includes a circuit board 100 having an IC 102 and optionally one or more support circuits ("support circuit(s) 104"). The IC 102 can be a programmable IC, such as FPGA, CPLD, or the like. Alternatively, the IC 102 can be a mask-programmable IC, such as an ASIC, application specific standard product (ASSP), or the like. In some examples, the IC 102 can be a system on a chip (Soc) that can include a processing system (e.g., microprocessor(s), memory, controller(s), peripheral(s), etc.) and optionally programmable logic. The support circuit(s) 104 can include other ICs and/or circuits that support operation of the IC 102, such as memory circuits, input/output (IO) circuits, power supply circuits, and the like. In general, the IC 102 implements an circuit design 106. For example, a programmable IC can be programmed with a bitstream to implement the circuit design 106. An ASIC can be manufactured using masks to implement the circuit design 106. The circuit design 106 can include one or more core implementations ("core implementation(s) 108"). Each of the core implementation(s) 108 is an implementation of core, as described below.

Figure 2:
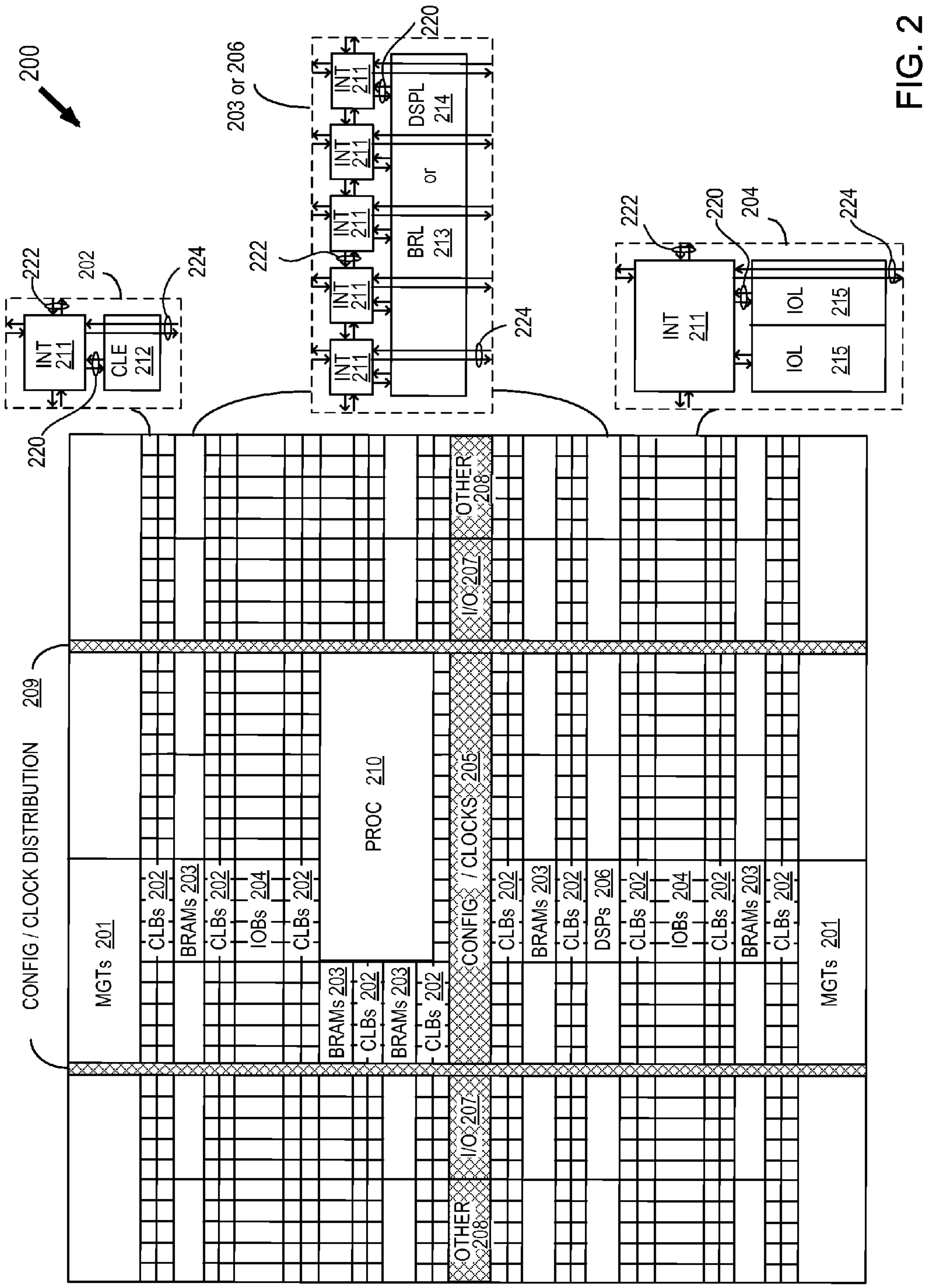
FIG. 2 illustrates an FPGA architecture according to an example implementation.

In an example implementation, the IC 102 comprises an FPGA. FIG. 2 illustrates an FPGA architecture 200 that includes a large number of different programmable tiles including multi-gigabit transceivers ("MGTs") 201, configurable logic blocks ("CLBs") 202, random access memory blocks ("BRAMs") 203, input/output blocks ("IOBs") 204, configuration and clocking logic ("CONFIG/CLOCKS") 205, digital signal processing blocks ("DSPs") 206, specialized input/output blocks ("I/O") 207 (e.g., configuration ports and clock ports), and other programmable logic 208 such as digital clock managers, analog-to-digital converters, system monitoring logic, and so forth. Some FPGAs also include dedicated processor blocks ("PROC") 210.

In some FPGAs, each programmable tile can include at least one programmable interconnect element ("INT") 211 having connections to input and output terminals 220 of a programmable logic element within the same tile, as shown by examples included at the top of FIG. 2. Each programmable interconnect element 211 can also include connections to interconnect segments 222 of adjacent programmable interconnect element(s) in the same tile or other tile(s). Each programmable interconnect element 211 can also include connections to interconnect segments 224 of general routing resources between logic blocks (not shown). The general routing resources can include routing channels between logic blocks (not shown) comprising tracks of interconnect segments (e.g., interconnect segments 224) and switch blocks (not shown) for connecting interconnect segments. The interconnect segments of the general routing resources (e.g., interconnect segments 224) can span one or more logic blocks. The programmable interconnect elements 211 taken together with the general routing resources implement a programmable interconnect structure ("programmable interconnect") for the illustrated FPGA. Each programmable interconnect element 211 can include an interconnect circuit that can implement various types of switching among input interconnect segments and output interconnect segments, such as cross-point switching, breakpoint switching, multiplexed switching, and the like.

In an example implementation, a CLB 202 can include a configurable logic element ("CLE") 212 that can be programmed to implement user logic plus a single programmable interconnect element ("INT") 211. A BRAM 203 can include a BRAM logic element ("BRL") 213 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 206 can include a DSP logic element ("DSPL") 214 in addition to an appropriate number of programmable interconnect elements. An IOB 204 can include, for example, two instances of an input/output logic element ("IOL") 215 in addition to one instance of the programmable interconnect element 211. As will be clear to those of skill in the art, the actual I/O pads connected, for example, to the I/O logic element 215 typically are not confined to the area of the input/output logic element 215.

In the pictured example, a horizontal area near the center of the die (shown in FIG. 2) is used for configuration, clock, and other control logic. Vertical columns 209 extending from this horizontal area or column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, processor block 210 spans several columns of CLBs and BRAMs. The processor block 210 can various components ranging from a single microprocessor to a complete programmable processing system of microprocessor(s), memory controllers, peripherals, and the like.

Note that FIG. 2 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 2 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 2 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

Figure 3:
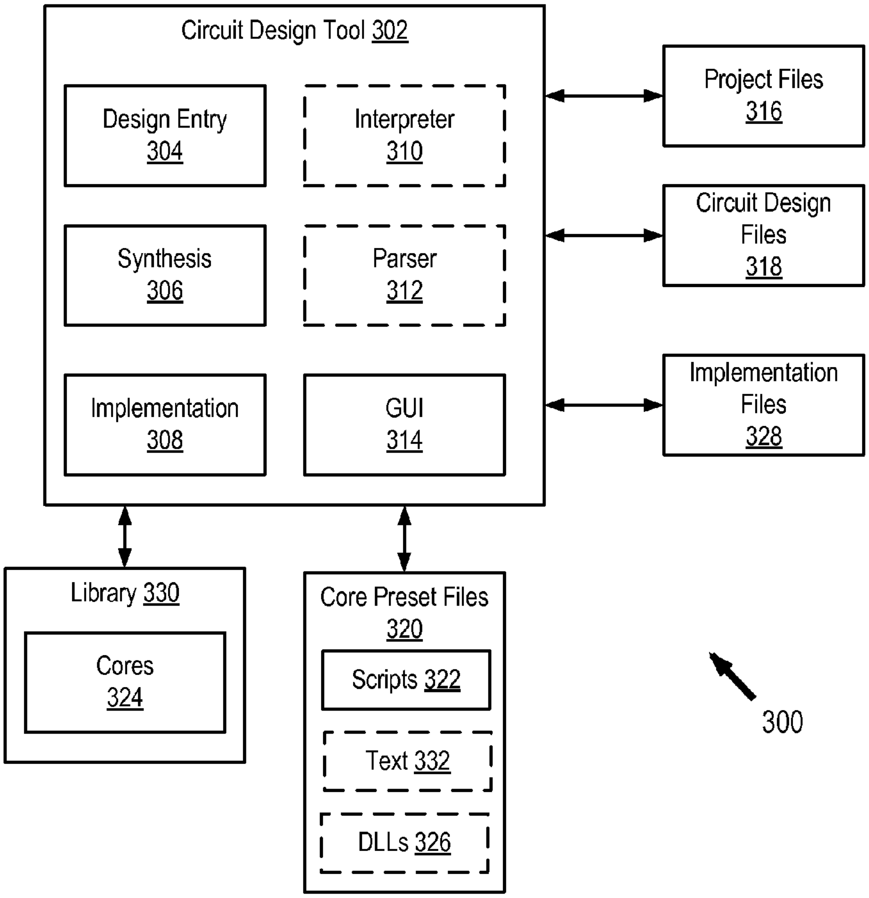
FIG. 3 is a block diagram depicting a circuit design system according to an example implementation.

FIG. 3 is a block diagram depicting a circuit design system 300 according to an example implementation. The circuit design system 300 includes a circuit design tool 302 having a design entry module 304, a synthesis module 306, an implementation module 308, and a graphical user interface (GUI) 314. The circuit design tool 302 can be implemented by circuitry that is part of an electronic system, by firmware in the electronic system, by software in the electronic system, or by a combination thereof. An example electronic system in which the circuit design system 300 can be implemented is described below with respect to FIG. 7.

In general, the circuit design system 300 generates a description of the circuit design, which is processed into a physical implementation ("implementation") of the circuit design for particular target hardware. The circuit design system 300 can process the description of the circuit design through various intermediate transformations to produce the implementation of the circuit design, including a functional description and a logical description. The implementation of the circuit design can be formatted and loaded into a programmable IC to produce a physical circuit, or used to produce physical masks to form an ASIC. Thus, the circuit design system 300 transforms an abstract representation of the circuit design (the description) into a physical representation of the circuit design (the implementation) that can be formatted to realize a physical circuit in an IC.

A user interacts with the circuit design tool 302 to produce project files 316 and circuit design files 318. The project files 316 include one or more files specifying project settings for each circuit design. For example, the project files 316 can specify attributes for target hardware of a circuit design, such as a type of IC in the target hardware, a model of the IC, a clock speed of the IC, a number of 10 ports of the IC, and the like. The circuit design files 318 include one or more files specifying a description of each circuit design. The description can be divided into different abstractions as discussed above, such as a functional description and a logical description. The circuit design tool 302 processes the circuit design files 318 to generate implementation files 328. The implementation files 328 include one or more files specifying a physical implementation of each circuit design, such as bitstream files for programmable ICs or mask files for ASICs.

The design entry module 304 is configured to generate a functional description of the circuit design in response to user input through the GUI 314. The functional description can include descriptions for a plurality of circuit components, such as flip-flops, memories, logic gates, processors, and the like, coupled together by connections (referred to as "nets" or "signals"). The functional description can include a register transfer level (RTL) description specified using a circuit design language, such as a hardware description language (HDL), and/or specified schematically. The functional description can include a high-level model description specified using a program language, such as C, C++, JAVA, or the like, and/or specified schematically. The functional description can include a combination of RTL and high-level model descriptions. The functional description can be stored in one or more of the circuit design files 318. The GUI 314 can include a graphic interface through which an end user connects symbols and blocks representing various components to produce a schematic of the circuit design. The GUI 314 can include a text interface through which a user writes HDL/program language code. The GUI 314 can employ a combination of schematic and text-based entry.

The synthesis module 306 is configured to produce a logical description of the circuit design from the functional description. The logical description of the circuit design includes a logical representation of the circuit design in terms of specific logic elements. For example, the synthesis tool 212 can perform "technology mapping" that transforms generic circuit elements into technology-specific circuit elements. For example, the logical description can include a representation of the circuit design in terms of specific logic elements optimized to the architecture of a programmable IC, such as lookup tables (LUTs), carry logic, IO buffers, and like technology-specific components. In an example, the logical description includes a logical network list ("netlist") supported by an IC of the target hardware. The logical description can be stored in one or more of the circuit design files 318.

The implementation module 308 is configured to produce an implementation of the circuit design from the logical description. The implementation of the circuit design is a physical representation of the circuit design for implementation in target hardware. For example, the implementation module 308 can map, place, and route the logical description for implementation in a programmable IC of the target hardware. The physical implementation can include a bitstream for configuring the programmable IC with a circuit specified by the circuit design. In another example, the implementation module 308 can place and route the logical description for implementation in an ASIC or the like. The implementation can include a set of mask definitions for manufacturing an ASIC with the circuit specified by the circuit design. The implementation can be stored in one or more of the implementation files 328.

The circuit design tool 302 can access a library 330 having a plurality of cores 324. Some or all of the cores 324 are parameterized. The design entry module 304, through the GUI 314, can provide an interface for an end user to create instances of one or more of the cores 324 in the functional description. Each parameterized core has at least one configuration file associated therewith ("core preset files 320"). Each of the core preset files 320 defines one or more preset configurations of a given parameterized core through the specification of one or more sets of parameter values. The design entry module 304 identifies selection of a parameterized core by the end user to be instantiated in the description of the circuit design. In response, the design entry module 304 identifies associated core preset file(s) for the parameterized core and presents representations of preset configuration(s) contained in the core preset file(s) to the end user through the GUI 314. When the end user selects a preset configuration, the design entry module 304 processes a respective core preset file, which sets the parameters of the parameterized core to the parameter values defined in the selected preset configuration. The design entry module 304 then creates an instance of the parameterized core having the parameter values of the selected preset configuration in the description of the circuit design.

In general, a given parameterized core can include a plurality of parameters, and a given preset configuration can define parameter values for one or more of the plurality of parameters. That is, a given preset configuration can define parameter values for all of the parameters of a parameterized core, or only a subset of the parameters of the parameterized core. Thus, in some cases, the parameterized core can include parameters undefined in a given preset configuration. The design entry module 304 can determine values of the undefined parameters when creating an instance of the parameterized core. For example, the design entry module 304 can assign default values to one or more undefined parameters. In another example, one or more undefined parameters may be dependent on parameters defined by a preset configuration and are assigned values based on values of associated defined parameters.

Figure 4:
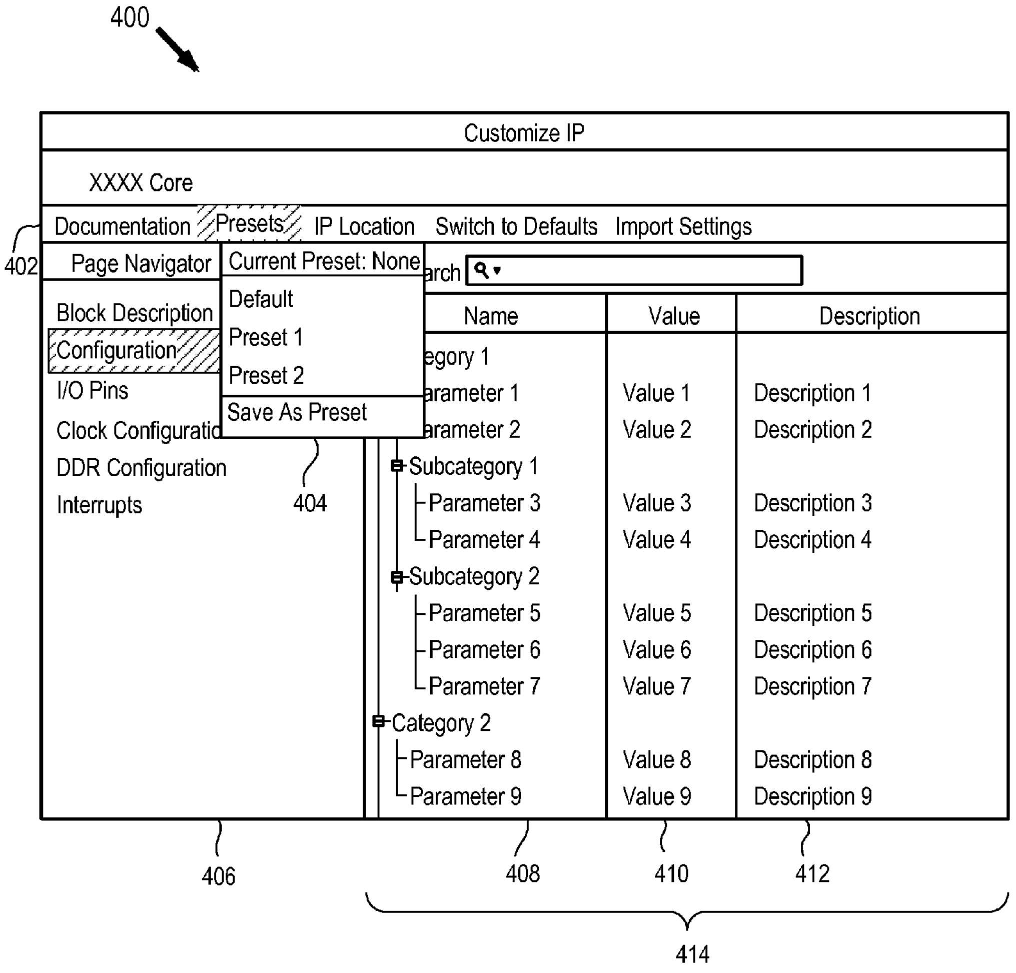
FIG. 4 illustrates a GUI according to an example implementation.

FIG. 4 illustrates a GUI 400 according to an example implementation. The GUI 400 can be invoked upon selection of a parameterized core to instantiate in the circuit design. The GUI 400 can be presented as part of the GUI 314 of the circuit design tool 302. In the present example, a core named "XXXX" is selected by the end user. The GUI 400 generally includes a menu bar 402, a page navigator view 406, and a detail view 414. The menu bar 402 includes various menu entries, including a menu entry "presets" for selecting a preset configuration for the XXXX core. The menu entry "presets" is shown selected, which displays a menu 404. The menu 404 includes an entry displaying the currently applied preset, entries for selecting preset configurations for the XXXX core, and an entry to save a current configuration of parameters as a new preset configuration for the XXXX core. In the present example, the XXXX core has three preset configurations, including a "default" configuration, a "preset 1" configuration, and a "preset 2" configuration.

The page navigator view 406 includes a list of pages that display different data for the XXXX core. In the present example, the page navigator view 406 includes entries for a "block description", a "configuration", "I/O pins", "clock configuration", "DDR configuration", and "interrupts" for the XXXX core. For example, the XXXX core can be a processing system core having microprocessor(s), memory, controller(s), peripheral(s), and the like. In the present example, the "configuration" page is selected, which shows a table of parameters, associated parameter values and descriptions for the XXXX core in the detail view 414. In particular, the detail view 414 includes a column 408 showing a list of parameters, a column 410 showing a list of parameter values, and a column 412 showing a list of parameter descriptions. The parameters in the column 408 are organized as a tree having parameter categories/subcategories and associated parameters. The present example shows nine parameters designated "parameter 1" through "parameter 9", each having a respective "value 1" through "value 9" and a respective "description 1" through "description 9". The GUI 400 is merely one example GUI for displaying parameters, values, and descriptions, and for allowing selection and saving of preset configurations for a parameterized core.

Returning to FIG. 3, in one example, the core preset files 320 include scripts 322 that can be executed by an interpreter 310 in the circuit design tool 302. In general, the interpreter 310 executes a script 322 in response to an end user selecting a parameterized core to instantiate in the description of the circuit design. The script 322 can define one or more functions, including a function that provides a set of parameter values for a parameterized core as output ("apply preset function"). In some examples, the "apply preset function" specifies a single set of parameter values, which is output without considering any input. In other examples, the "apply preset function" specifies multiple sets of parameter values, from which a single set is conditionally selected based in parametric input. For example, the function can take one or more input arguments and/or have access to one or more global defined variables. In some examples, the parametric input for an "apply preset function" can include attributes of target hardware defined in a project file 316. Each of the scripts 322 can include other types of functions, such as a function that provides information about preset configuration(s) and/or a function that determines applicability of preset configuration(s). The script can be defined using any type of scripting language, such as the tool command language (TCL), practical extracting and reporting language (Perl), UNIX shell scripting language, Python, Ruby, and the like.

FIG. 5A illustrates example functions that can be employed in a script of a core preset file. In the present example, the functions are described using TCL. A function 502, designated "getPresetInfo( )", operates to return general data for a preset configuration for a given parameterized core. The general data can include, for example, a name of the preset configuration, text to display to the end user for selecting the preset configuration, a description of the preset configuration, an identifier for the preset configuration, and an author of the preset configuration.

A function 504, designated "isPresetApplicable( )", operates to determine if the preset configuration is applicable to the current circuit design. In the present example, the "isPresetApplicable( )" function accesses a globally defined variable "boardName" that is an attribute of the target hardware generally identifying the target hardware. For example, the "boardName" variable can be defined in a project file for the circuit design. The "isPresetApplicable( )" function can control whether the preset configuration is presented to the end user as a selectable option for the given parameterized core.

A function 506, designated "applyPreset( )", operates to return a set of parameter values for the preset configuration. In the present example, the "applyPreset( )" function returns a dictionary, where keys are parameters of the parameterized core and the values are parameter values. The function 506 defines a single set of parameter values 508, which is returned without considering any input. In the example, the function 506 returns parameter values for "parameter 1" through "parameter 4". As noted above, the parameterized core may have more than four parameters. The parameters undefined in the set 508 can receive default values and/or values derived from the parameter values in the set 508 (e.g., dependent parameters).

FIG. 5B illustrates another example function that can be employed in a script of a core preset file. In the present example, the function is described using TCL. A function 510, designated "applyPreset( )", operates to return a set of parameter values for a preset configuration. The function 510 defines two sets 512*a* and 512*b* of parameter values. The function 510 selectively returns a dictionary relating parameters and parameter values for one of the preset configurations based on the value of a global variable "device" that is an attribute of the target hardware. For example, the "device" variable can be defined in a project file for the circuit design. In the example, the set 512*a* defines parameter values for more parameters than the set 512*b*. As noted above, the parameters undefined in any given parameter set can receive default values and/or values derived from the defined parameters (e.g., dependent parameters).

Returning to FIG. 3, in some examples, the core preset files 320 can include other types of files in addition to, or as an alternative to, the scripts 322. For example, the core preset files 320 can include text files 332. Each of text files 332 can specify set(s) of parameter values for a parameterized core in any type format, such as extensible markup language (XML), comma-separated value (CSV), or the like. Each of the text files 332 can also specify other types of information related to the preset configuration, such as the information in the "getPresetInfo( )" function described above. Each of the text files 332 can also specify commands in a format understood by the design entry module 304 to implement dynamic behavior, as described above in the example script functions (e.g., commands to dynamically select a preset configuration from a plurality of preset configurations based on attribute(s) of the target hardware). The circuit design tool 302 can include a parser 312 to process the text files 332.

In another example, the core preset files 320 can include dynamic linked libraries (DLLs) 326. Each of the DLLs 326 comprises object code that can be dynamically linked with the object code of the design entry module 304 and executed to impart the same functionality of the script functions discussed above. For example, each of the DLLs 326 can specify set(s) of parameter values for a parameterized core. Each of the DLLs 326 can also specify other types of information related to the preset configuration, such as the information in the "getPresetInfo( )" function described above. Each of the DLLs 326 can also specify commands to implement dynamic behavior, as described above in the example script functions (e.g., commands to dynamically select a preset configuration from a plurality of preset configurations based on attribute(s) of the target hardware).

Figure 6:
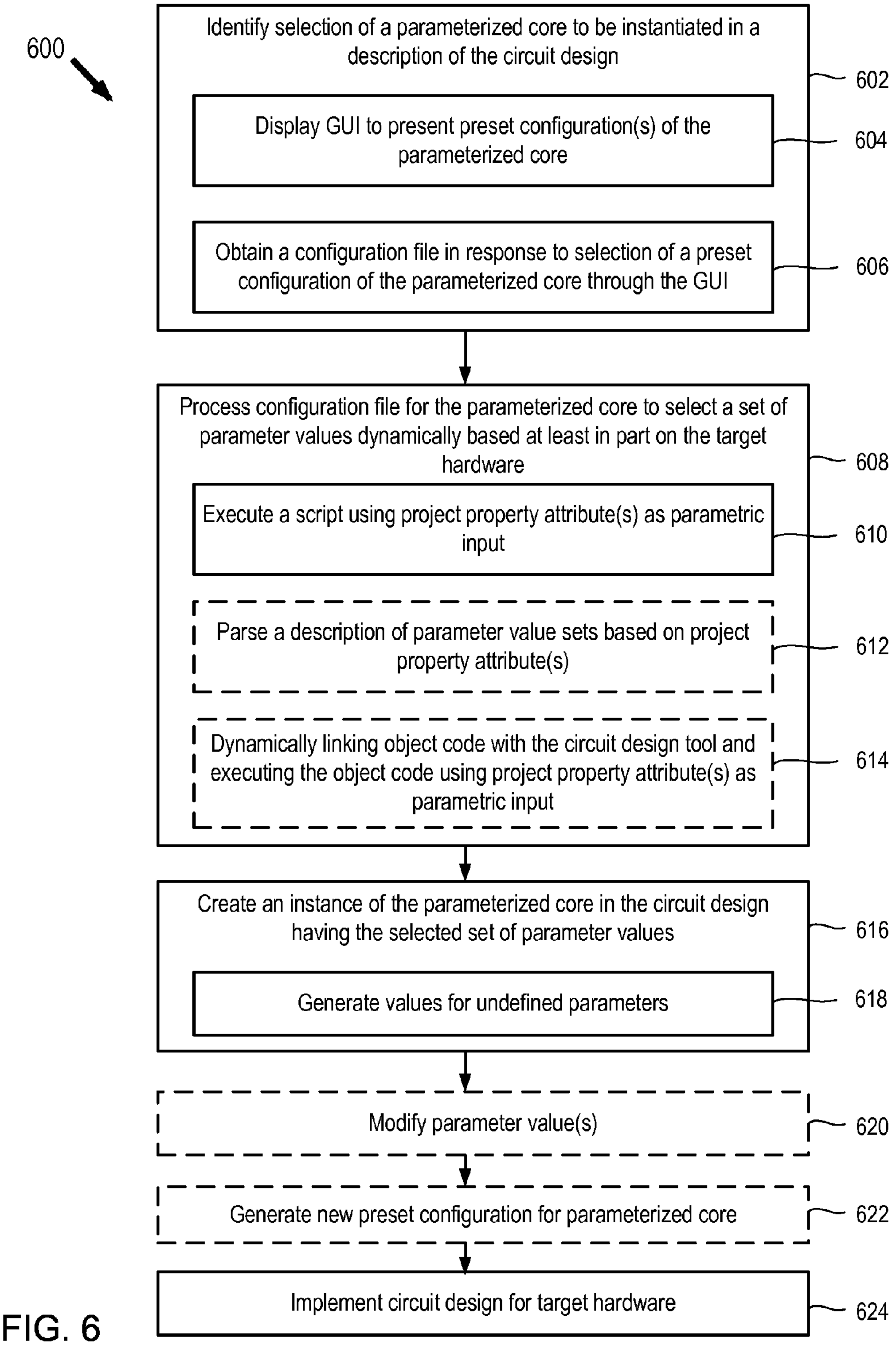
FIG. 6 is a flow diagram depicting a method of processing a circuit design in a circuit design tool according to an example implementation.

FIG. 6 is a flow diagram depicting a method 600 of processing a circuit design in a circuit design tool according to an example implementation. The method 600 can be performed by the circuit design tool 302 shown in FIG. 3. The method 600 begins at step 602, where the circuit design tool 302 identifies selection of a parameterized core to be instantiated in a description of the circuit design. The step 602 can include a step 604 and a step 606. At step 604, the circuit design tool 302 displays a GUI to present preset configuration(s) of the parameterized core to an end user. At step 606, the circuit design tool 302 obtains a configuration file for the parameterized core in response to selection of a preset configuration through the GUI.

At step 608, the circuit design tool 302 processes the configuration file for the parameterized core to select a set of parameter values dynamically based at least in part on the target hardware. The step 608 can include steps 610-614. At step 610, the circuit design tool 302 executes a script using project property attribute(s) as parametric input (e.g., attributes of the target hardware). At optional step 612, the circuit design tool 302 parses a description of parameter value sets (e.g., a text file) based on project property attribute(s) (e.g., attributes of the target hardware). At optional step 614, the circuit design tool 302 dynamically links with object code and executes the object code using project property attribute(s) as parametric input (e.g., attributes of the target hardware).

At step 616, the circuit design tool 302 creates an instance of the parameterized core in the circuit design having the selected set of parameter values. The step 616 can include a step 618, where the circuit design tool generates values for parameters undefined in the selected set of parameter values. At optional step 620, the circuit design tool 302 can modify one or more parameter value(s) in response to input from an end user. At optional step 622, the circuit design tool 302 can generate a new preset configuration for the parameterized core in response to the modification of parameter(s). At step 624, the circuit design tool 302 implements the circuit design for target hardware.

Figure 7:
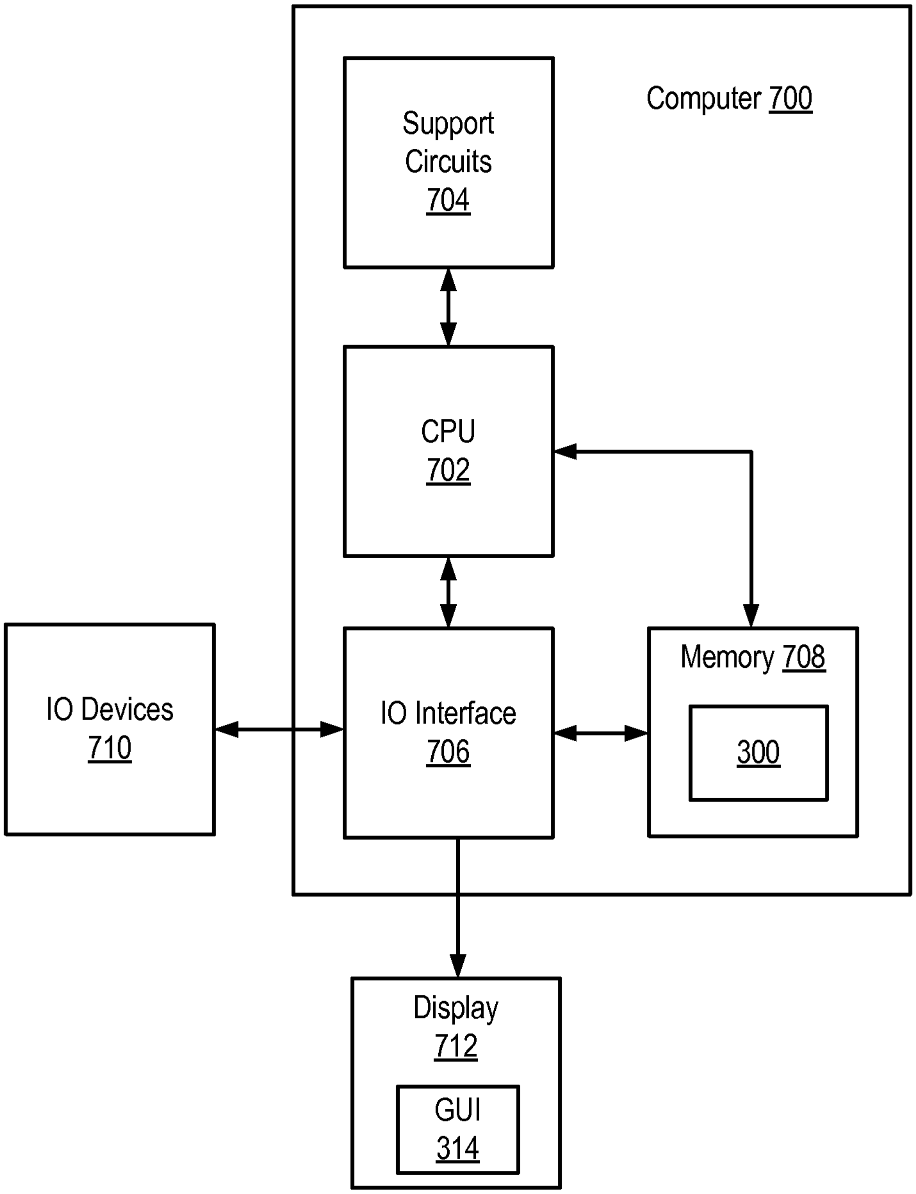
FIG. 7 is a block diagram depicting a computer suitable for implementing the methods and systems described herein.

FIG. 7 is a block diagram depicting a computer 700 suitable for implementing the methods and systems described herein. The computer 700 includes a central processing unit (CPU) 702, a memory 708, various support circuits 704, and an IO interface 706. The CPU 702 can include one or more microprocessors. The support circuits 704 can include conventional cache, power supplies, clock circuits, data registers, IO interfaces, and the like. The IO interface 706 may be directly coupled to the memory 708 or coupled through the CPU 702. The IO interface 706 can be coupled to various 10 devices 710, such as conventional keyboard, mouse, printer, and the like, as well as a display 712. The display 712 can be used to present a GUI, such as the GUI 314.

The memory 708 may store all or portions of one or more programs and/or data to implement the systems and methods described herein. For example, the memory 708 can store programs for implementing the circuit design system 300 of FIG. 3. The memory 708 can include one or more of random access memory (RAM), read only memory (ROM), magnetic read/write memory, and the like.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including hand-held devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific examples, other and further examples may be devised without departing from the basic scope thereof, and the scope thereof is determined by the claims that follow.

What is claimed is:

1. A method of processing a circuit design in a circuit design tool, comprising:

identifying selection of a parameterized core to be instantiated in a description of the circuit design managed by the circuit design tool and configured for implementation in target hardware;

processing a configuration file for the parameterized core to select a set of parameter values from a plurality of sets of parameter values dynamically based at least in part on the target hardware;

creating an instance of the parameterized core in the circuit design having the selected set of parameter values; and implementing the circuit design for the target hardware.

2. The method of claim 1, further comprising:

displaying a graphical user interface (GUI) of the circuit design tool to present a representation of at least one predefined configuration of the parameterized core; and obtaining the configuration file in response to selection of a predefined configuration of the parameterized core through the GUI.

3. The method of claim 1, wherein:

the configuration file comprises a script; and the processing comprises executing the script within the circuit design tool using at least one attribute defined by the circuit design tool for the circuit design as a parametric input.

4. The method of claim 3, wherein the script comprises a function having conditional instructions to select among the plurality of sets of parameter values based on a value of the at least one attribute.

5. The method of claim 4, wherein the script comprises a tool command language (TCL) script.

6. The method of claim 1, wherein:

the configuration file comprises a description of the plurality of sets of parameter values; and the processing comprises parsing the description of the plurality of sets of parameter values in the circuit design tool to obtain the set of parameter values based on at least one attribute defined by the circuit design tool for the circuit design.

7. The method of claim 1, wherein:

the configuration file comprises object code; and the processing comprises dynamically linking the object code with the circuit design tool and executing the object code using at least one attribute defined by the circuit design tool for the circuit design as a parametric input.

8. The method of claim 1, wherein:

the set of parameter values comprises a subset of parameter values for the parameterized core; and the creating the instance comprises generating values for parameters undefined in the set of parameter values based on parameters defined in the set of parameter values.

9. The method of claim 1, further comprising:

modifying a value of each of at least one parameter of the parameterized core; and generating a new configuration file for the parameterized code having a new set of parameter values in response to the modifying.

10. The method of claim 1, wherein:

the target hardware comprises a programmable IC; and the implementing comprises generating a physical implementation of the circuit design for configuring the programmable IC.

11. A non-transitory computer readable medium comprising instructions which, when executed in a computer system, cause the computer system to carry out a method of processing a circuit design in a circuit design tool, comprising:

identifying selection of a parameterized core to be instantiated in a description of the circuit design managed by the circuit design tool and configured for implementation in target hardware;

processing a configuration file for the parameterized core to select a set of parameter values from a plurality of sets of parameter values dynamically based at least in part on the target hardware;

creating an instance of the parameterized core in the circuit design having the selected set of parameter values; and implementing the circuit design for the target hardware.

12. The non-transitory computer readable medium of claim 11, wherein:

the configuration file comprises a script; and the processing comprises executing the script within the circuit design tool using at least one attribute defined by the circuit design tool for the circuit design as a parametric input.

13. The non-transitory computer readable medium of claim 12, wherein the script comprises a function having conditional instructions to select among the plurality of sets of parameter values based on a value of the at least one attribute.

14. The non-transitory computer readable medium of claim 11, wherein:

the configuration file comprises a description of the plurality of sets of parameter values; and the processing comprises parsing the description of the plurality of sets of parameter values in the circuit design tool to obtain the set of parameter values based on at least one attribute defined by the circuit design tool for the circuit design.

15. The non-transitory computer readable medium of claim 11, wherein:

the configuration file comprises object code; and the processing comprises dynamically linking the object code with the circuit design tool and executing the object code using at least one attribute defined by the circuit design tool for the circuit design as a parametric input.

16. A computer system including a circuit design tool executing therein configured to process a circuit design, comprising:

a design entry module configured to:

identify selection of a parameterized core to be instantiated in a description of the circuit design managed by the circuit design tool and configured for implementation in target hardware;

process a configuration file for the parameterized core to select a set of parameter values from a plurality of sets of parameter values dynamically based at least in part on the target hardware; and create an instance of the parameterized core in the circuit design having the selected set of parameter values; and an implementation module configured to implement the circuit design for the target hardware.

17. The computer system of claim 16, wherein:

the configuration file comprises a script; and the design entry module executes the script within the circuit design tool using at least one attribute defined by the circuit design tool for the circuit design as a parametric input.

18. The computer system of claim 17, wherein the script comprises a function having conditional instructions to select among the plurality of sets of parameter values based on a value of the at least one attribute.

19. The computer system of claim 16, wherein:

the configuration file comprises a description of the plurality of sets of parameter values; and the design entry module parses the description of the plurality of sets of parameter values in the circuit design tool to obtain the set of parameter values based on at least one attribute defined by the circuit design tool for the circuit design.

20. The computer system of claim 16, wherein:

the configuration file comprises object code; and the design entry module dynamically links the object code with the circuit design tool and executes the object code using at least one attribute defined by the circuit design tool for the circuit design as a parametric input.

* * * * *